United States Patent
Xu et al.

(10) Patent No.: US 10,011,178 B1
(45) Date of Patent: Jul. 3, 2018

(54) DC INVERTER HAVING REDUCED SWITCHING LOSS AND REDUCED VOLTAGE SPIKES

(71) Applicant: Ford Global Technologies, LLC, Dearborn, MI (US)

(72) Inventors: Zhuxian Xu, Novi, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/617,239

(22) Filed: Jun. 8, 2017

(51) Int. Cl.
*H02P 1/00* (2006.01)
*B60L 11/18* (2006.01)
*H02M 7/5395* (2006.01)
*H02M 1/08* (2006.01)
*B60L 11/08* (2006.01)
*H02P 27/08* (2006.01)
*H02P 9/30* (2006.01)
*H02M 1/00* (2006.01)

(52) U.S. Cl.
CPC .......... *B60L 11/1803* (2013.01); *B60L 11/08* (2013.01); *H02M 1/08* (2013.01); *H02M 7/5395* (2013.01); *H02P 9/305* (2013.01); *H02P 27/08* (2013.01); *H02M 2001/0054* (2013.01)

(58) Field of Classification Search
CPC ...... H02P 2201/07; H02P 29/50; H02P 13/06; H02P 25/16; H02P 27/08; H02P 3/18; H02P 3/22; H02P 6/24; H02P 27/085
USPC .................................................... 318/139, 34
See application file for complete search history.

(56) References Cited

U.S. PATENT DOCUMENTS

| | | | | |
|---|---|---|---|---|
| 5,469,041 A * | 11/1995 | Bourgeois | ............. | H02M 7/538 318/801 |
| 6,166,933 A | 12/2000 | Bowers | | |
| 6,636,107 B2 * | 10/2003 | Pelly | ....................... | H02M 1/12 327/552 |
| 6,794,929 B2 * | 9/2004 | Pelly | ....................... | H02M 1/12 327/551 |
| 7,176,644 B2 * | 2/2007 | Ueda | ....................... | H02P 6/182 318/400.14 |

(Continued)

FOREIGN PATENT DOCUMENTS

| | | |
|---|---|---|
| CN | 105140906 A | 12/2015 |
| JP | 5179954 B2 | 1/2013 |

*Primary Examiner* — David S Luo
(74) *Attorney, Agent, or Firm* — David B. Kelley; MacMillan, Sobanski & Todd, LLC

(57) ABSTRACT

An electrified vehicle propulsion system uses current feedback to modify gate drive signals to suppress voltage spikes and increase switching efficiency. A DC link having a link capacitor and a link inductance is connected to first and second converters. A first converter bridge has a first phase leg with first upper and lower switching devices, each switching device having a respective gate loop. A second converter bridge has a second phase leg with second upper and lower switching devices, each switching device having a respective gate loop. A plurality of gate drivers provide gate drive signals to respective gate loops for turning the respective switching devices on and off. A plurality of gate coils are provided, wherein each gate coil is connected in series between a respective gate driver and a respective gate loop. Each gate coil is respectively inductively coupled to the link inductance.

19 Claims, 6 Drawing Sheets

(56) References Cited

U.S. PATENT DOCUMENTS

| | | | |
|---|---|---|---|
| 7,187,229 B2* | 3/2007 | Pelly | H02M 1/12 327/551 |
| 7,385,438 B2* | 6/2008 | Pelly | H02M 1/12 327/532 |
| 7,583,136 B2* | 9/2009 | Pelly | H02M 1/12 327/532 |
| 7,781,997 B2* | 8/2010 | Kallioniemi | H02P 6/24 318/379 |
| 7,923,951 B2* | 4/2011 | Soma | B60L 3/0046 180/65.1 |
| 8,120,295 B2* | 2/2012 | Soma | B60L 7/14 318/139 |
| 8,144,443 B2 | 3/2012 | Kim | |
| 8,223,515 B2* | 7/2012 | Abolhassani | H01F 27/385 363/34 |
| 8,406,026 B2* | 3/2013 | Fukuta | H02M 1/084 363/132 |
| 8,456,866 B2* | 6/2013 | Funaba | H02M 1/08 363/17 |
| 8,736,102 B1* | 5/2014 | Gao | H02M 3/28 307/17 |
| 8,823,207 B2* | 9/2014 | Watanabe | H02M 1/44 307/10.1 |
| 8,848,408 B2* | 9/2014 | Shindo | B60L 3/0007 180/279 |
| 9,431,386 B2 | 8/2016 | Zhang et al. | |
| 2001/0045863 A1* | 11/2001 | Pelly | H02M 1/12 327/552 |
| 2004/0004514 A1* | 1/2004 | Pelly | H02M 1/12 327/552 |
| 2004/0207463 A1* | 10/2004 | Pelly | H02M 1/12 327/552 |
| 2007/0120607 A1* | 5/2007 | Pelly | H02M 1/12 330/302 |
| 2008/0180164 A1* | 7/2008 | Pelly | H02M 1/12 327/552 |
| 2009/0048602 A1* | 2/2009 | O'Donoghue | A61B 17/1615 606/80 |
| 2009/0167216 A1* | 7/2009 | Soma | B60L 7/14 318/376 |
| 2009/0167217 A1* | 7/2009 | Soma | B60L 3/0046 318/376 |
| 2009/0167218 A1* | 7/2009 | Kallioniemi | H02P 6/24 318/379 |
| 2010/0127647 A1* | 5/2010 | Huang | H02M 3/1582 318/400.11 |
| 2010/0213921 A1* | 8/2010 | Abolhassani | H01F 27/385 323/328 |
| 2011/0058400 A1* | 3/2011 | Fukuta | H02M 1/084 363/131 |
| 2012/0019231 A1* | 1/2012 | Chen | H02M 3/155 323/312 |
| 2012/0051099 A1* | 3/2012 | Funaba | H02M 1/08 363/21.17 |
| 2012/0081045 A1* | 4/2012 | Takamatsu | B60L 3/003 318/400.3 |
| 2012/0099348 A1* | 4/2012 | Umetani | H02M 3/158 363/37 |
| 2012/0134181 A1* | 5/2012 | Amano | H02M 1/08 363/21.12 |
| 2012/0212160 A1* | 8/2012 | Shindo | B60L 3/0007 318/139 |
| 2013/0026955 A1* | 1/2013 | Kikunaga | H02P 27/085 318/51 |
| 2013/0039097 A1* | 2/2013 | Watanabe | H02M 1/44 363/21.01 |
| 2013/0093376 A1* | 4/2013 | Yoo | H02M 1/126 318/503 |
| 2013/0147431 A1* | 6/2013 | Lim | H02J 7/022 320/109 |
| 2014/0191784 A1* | 7/2014 | Hatanaka | H01L 27/0629 327/109 |
| 2015/0078039 A1* | 3/2015 | Miyauchi | H02M 1/08 363/21.12 |
| 2015/0085538 A1* | 3/2015 | Miyauchi | H02M 1/084 363/21.17 |
| 2015/0364984 A1* | 12/2015 | Miyauchi | H03K 17/567 363/132 |
| 2016/0294275 A1 | 10/2016 | Pronovost et al. | |
| 2016/0329823 A1* | 11/2016 | Nakamura | H02M 3/33561 |

* cited by examiner

DC INVERTER HAVING REDUCED SWITCHING LOSS AND REDUCED VOLTAGE SPIKES

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to controlling switching transients for power switching transistors, and, more specifically, to modified gate drive signals for power inverters of a type used in electrified vehicles wherein switching speed adapts to a total current flow between a DC link and the inverter.

Electrified vehicles, such as hybrid electric vehicles (HEVs), plug-in hybrid electric vehicles (PHEVs), and battery electric vehicles (BEVs), use inverter-driven electric machines to provide traction torque. A typical electric drive system includes a DC power source (such as a battery pack or a fuel cell) coupled by contactor switches to a variable voltage converter (VVC) to regulate a main bus voltage across a main DC link capacitor. An inverter is connected between the main buses for the DC link and a traction motor in order to convert the DC power to an AC power that is coupled to the windings of the motor to propel the vehicle. A generator inverter may also be connected to the DC link so that AC power from a generator driven by an internal combustion engine can supply DC power onto the link for recharging the battery and/or powering the traction motor.

The inverter(s) and VVC include transistor switching devices (such as insulated gate bipolar transistors, or IGBTs) connected in a bridge configuration including one or more phase legs. A typical configuration includes a three-phase motor driven by an inverter with three phase legs. An electronic controller turns the switches on and off in order to invert a DC voltage from the bus to an AC voltage applied to the motor. The inverter is controlled in response to various sensed conditions including the rotational position of the electric machine and the current flow in each of the phases.

The inverter for the motor may preferably pulse-width modulate the DC link voltage in order to deliver an approximation of a sinusoidal current output to drive the motor at a desired speed and torque. Pulse Width Modulation (PWM) control signals are applied to drive the gates of the IGBTs in order to turn them on and off as necessary. In an idealized form, the gate drive control signals are square wave signals that alternate each power switching device (e.g., IGBT) between a fully off and a fully on (saturated) state. During turn off and turn on, it takes time for the device to respond to the change in the gate drive signal. For example, after the gate drive signal transitions from a turn-off state to a turn-on state, conduction through the device output transitions from zero current flow to a maximum current flow within a few microseconds.

The optimal switching speed of a power semiconductor transistor device such as an IGBT is a tradeoff between high stresses which could destroy the device at very fast switching speeds and reduced efficiency and increase power losses at slower switching speeds. In particular, when a switching device is turned off as a result of its gate drive signal ($V_{GE}$) transitioning to its turn-off voltage level, the voltage across the device ($V_{CE}$) rises while the device output current ($I_C$) drops. Due to transients, $V_{CE}$ typically overshoots the supply voltage (e.g., the DC link voltage). To prevent these resulting voltage spikes from damaging the switching devices, a typical design uses switching devices with voltage ratings much higher than the supply voltages being used.

In an electrified vehicle propulsion system having more than one separate switching bridge connected to the same DC link (e.g., a VVC and an inverter or two inverters), instances will occur in which two different switching devices will be turning off simultaneously. Since the voltage overshoots can be additive, the voltage spikes can be even higher. Use of switching devices with augmented voltage ratings in order to withstand the spikes results in undesirable increases in parts cost, packaging space, and manufacturing cost.

SUMMARY OF THE INVENTION

In one aspect of the invention, an electrified vehicle propulsion system comprises a DC link having a link capacitor and a link inductance. A first converter bridge has a first phase leg with first upper and lower switching devices, each switching device having a respective gate loop. A second converter bridge has a second phase leg with second upper and lower switching devices, each switching device having a respective gate loop. A plurality of gate drivers provide gate drive signals to respective gate loops for turning the respective switching devices on and off. A plurality of gate coils are provided, wherein each gate coil is connected in series between a respective gate driver and a respective gate loop and is each respectively inductively coupled to the link inductance.

DETAILED DESCRIPTION OF PREFERRED EMBODIMENTS

Figure 1:
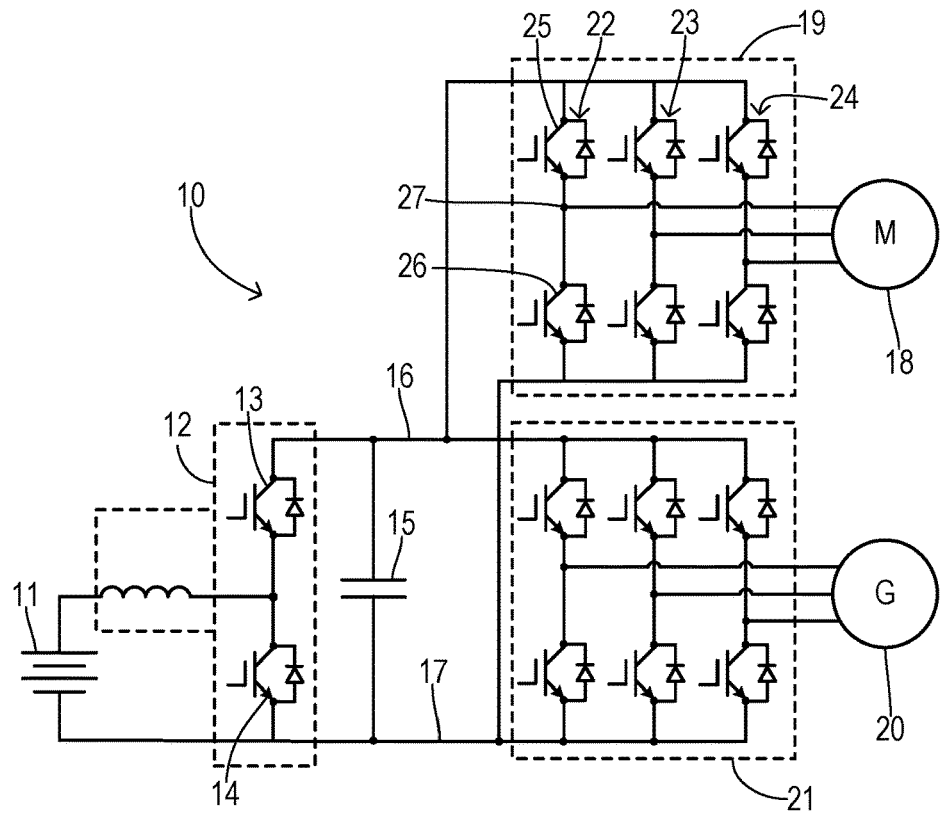
FIG. 1 is a schematic, block diagram showing an electric drive portion of a hybrid electric vehicle of a type for adopting the present invention.

Referring to FIG. 1, an electric drive section 10 of an electrified vehicle includes a battery 11 coupled by contactor relay switches (not shown) to a variable voltage converter (VVC) 12. VVC 12 includes upper switching device 13 and lower switching device 14 (e.g., insulated gate bipolar transistors or IGBTs) connected in series between a positive DC bus 16 and a negative DC bus 17. A main DC linking capacitor 15 is connected buses 16 and 17. VVC 12 typically performs a DC-DC conversion between a supply voltage of battery 11 and a higher DC link voltage adapted for operating with a motor 18 and a generator 20. A motor inverter 19 and a generator inverter 21 are coupled between buses 16 and 17. Inverters 19 and 21 are each comprised of a plurality of switching devices in a bridge configuration. For example, inverter 19 has three phase legs 22, 23, and 24. Phase leg 22 has an upper IGBT 25 in series with a lower IGBT 26, with a junction 27 between them connected to one phase winding of motor 18. The switching device in the other phase legs are similarly connected. The switching device in inverters 19 and 21 and in VVC 12 are driven according to control signals from a controller and gate driver (not shown) in a conventional manner (e.g., using pulse width modulation).

Figure 2:
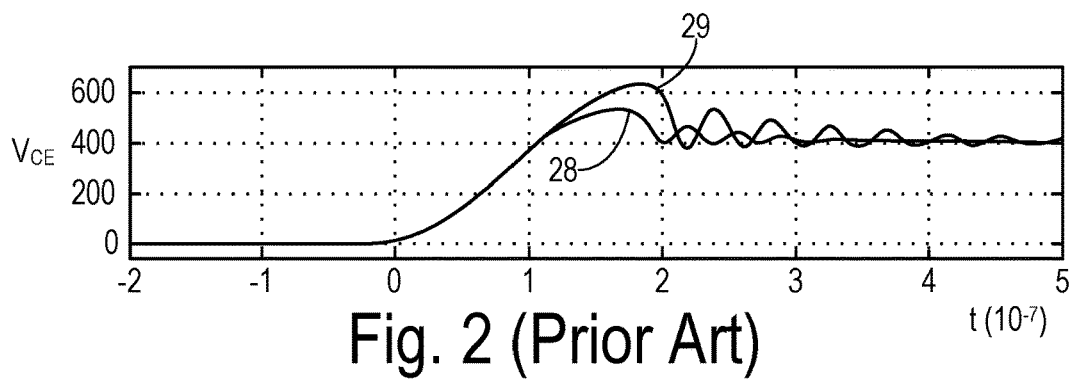
FIG. 2 is a graph showing a switching device collector voltage during turning off of the device, including voltage spikes occurring when only one device turns off and when two devices turn off simultaneously.

When two IGBTs are turned off at the same time (e.g., one in the generator inverter and one in the motor inverter, or one in the VVC and one in the motor inverter), the inductively induced voltage spike can be higher than in normal circumstances when only one device is turning off. This requires a greater safety margin for IGBT voltage ratings and reduces the efficiencies of power electronics converters. FIG. 2 shows turn-off switching behavior of an IGBT. A trace 28 shows a device voltage $V_{CE}$ when the IGBT switches off under normal operating conditions. A trace 29 shows voltage $V_{CE}$ when another IGBT (in another phase leg of another inverter/converter) is turning off simultaneously. The voltage spike applied on this individual IGBT is much higher in the second case (two IGBTs off simultaneously) than in the first case (normal).

Figure 3:
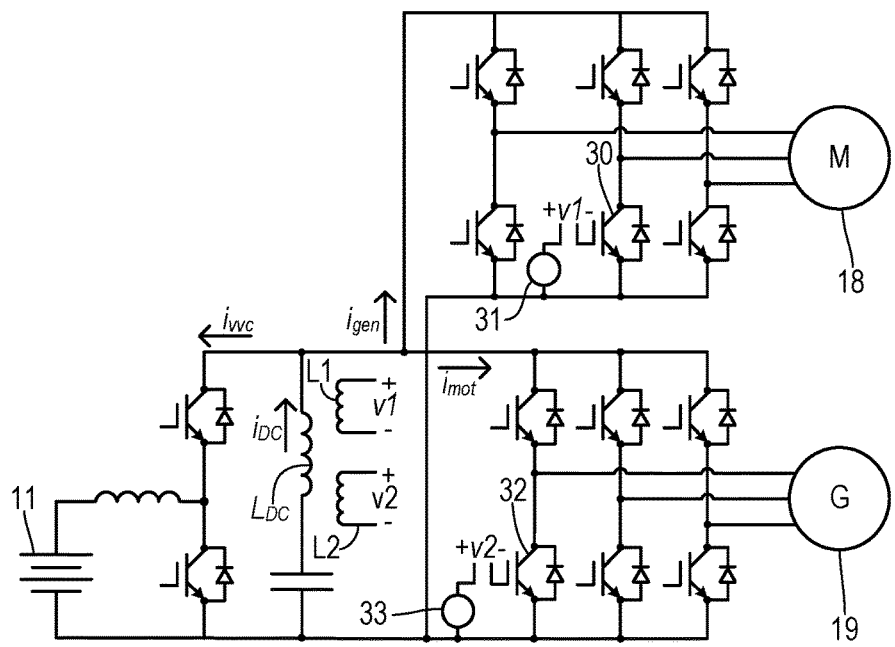
FIG. 3 is a schematic, block diagram showing an electric drive portion of a hybrid electric vehicle with inductive coupling between the gate loops and the DC link as used in the present invention.

In one aspect, this invention reduces the voltage spike in the special case when two IGBTs are turned off simultaneously, which helps to reduce the desired voltage rating for IGBTs. Additionally, the invention reduces the IGBT switching loss during normal operations. To achieve these objects, the embodiment of the invention shown in FIG. 3 takes advantage of a parasitic inductance ($L_{DC}$) that inherently arises in the electric drive system within the electrical current paths in the DC-link (e.g., capacitor leads and the main current-carrying busbars in a circuit module). It is noted that a current flowing through the parasitic inductance ($i_{DC}$) includes current through the generator inverter ($i_{gen}$), current through the motor inverter ($i_{mot}$), and current through the VVC ($i_{VVC}$) which are labeled in FIG. 3. A slope di/dt at which the current changes includes contributions due to the switching of IGBTs in the motor/generator inverters and the VVC. In order to sense the rate of change of current $i_{DC}$ (i.e., the slope di/dt), a coil L1 is added close to link inductance $L_{DC}$ in order to modify the turn-off performance of one respective IGBT. With a mutual inductance between $L_{DC}$ and L1 being denoted as M1, a voltage v1 induced across L1 can be derived from the following equation:

$$v1 = M1 \cdot \frac{di_{DC}}{dt}$$

L1 may preferably be comprised of a coil placed near DC link busbars to maximize the inductive coupling with parasitic inductance $L_{DC}$. The terminals of coil L1 are connected in series between an output of a gate driver 31 and the gate loop (i.e., the gate-to-emitter loop) of a corresponding IGBT 30 in the motor inverter. Preferably, every IGBT in the motor inverter, the generator inverter, and the VVC has its own dedicated coil in its respective gate loop. For simplicity, FIG. 3 only shows sensing coils and driver interconnections for two IGBTs. Thus, a second sensing coil L2 is separately inductively coupled to link inductance $L_{DC}$ and has output terminals connected between a gate driver 33 and a gate loop of an IGBT 32 in the generator inverter.

Figure 4A:
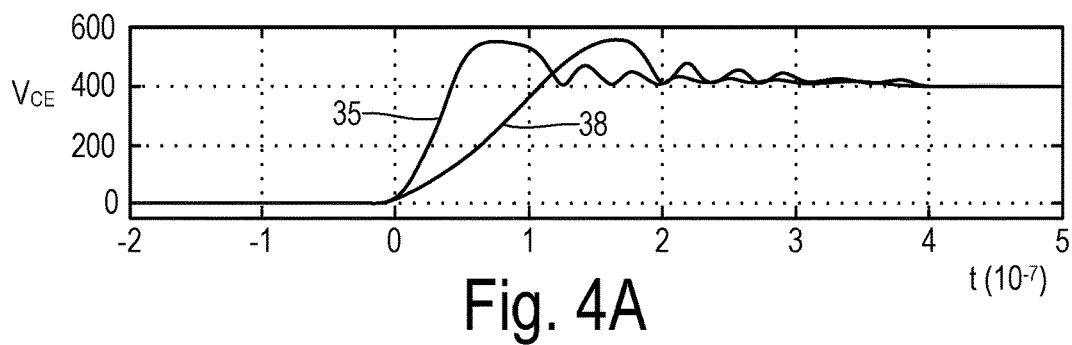
FIGS. 4A, 4B, and 4C are graphs showing collector voltage, collector current, and switching efficiency, respectively, during the turning off of one switching device in the electric drive of FIG. 3.
Figure 4B:
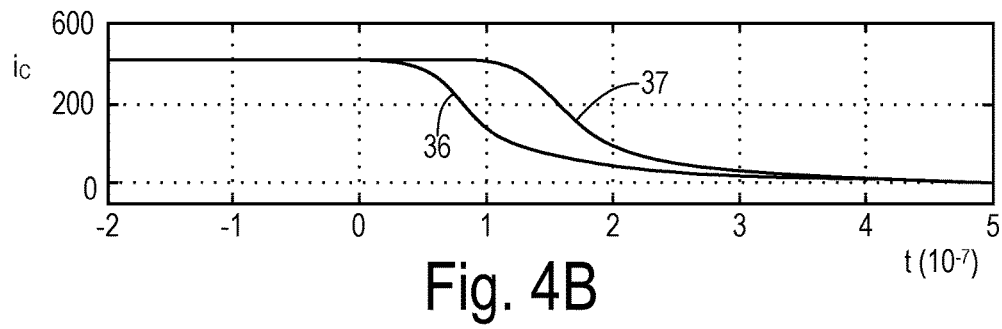
Figure 4C:
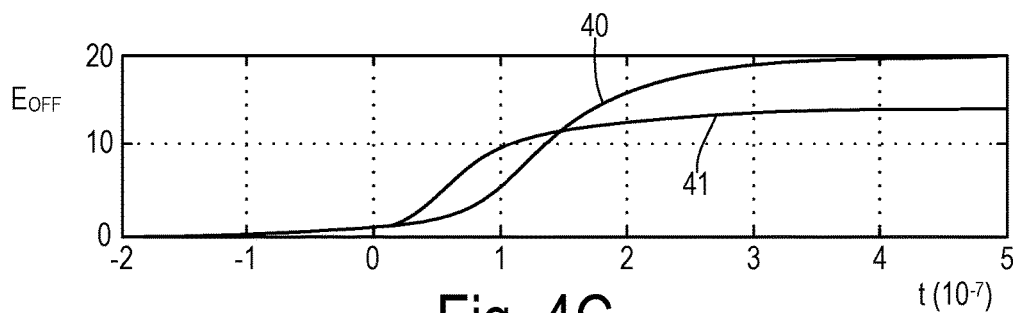

FIGS. 4A-4C compare IGBT turn-off switching performance in normal operation for an electric drive system with and without the added gate coils of the invention. During an IGBT turn-off transient, a voltage $V_{CE}$ across the IGBT output starts to increase. Without the present invention, the increase in voltage $V_{CE}$ occurs as shown at 38 in FIG. 4A. After $V_{CE}$ reaches a dc bus voltage VDC on the DC link, then the IGBT output current $I_C$ starts to decrease. The current decrease without the added gate coils is shown at 37 in FIG. 4B. The negative slope of the current (dIc/dt) in the particular IGBT also manifests as a decrease in the current flowing through the DC link (i.e., there is also a negative $dI_{DC}/dt$). This change in the DC link current induces a negative voltage in link inductance $L_{DC}$. The induced link voltage is sensed by gate coil L1 which creates a negative voltage v1 which is added to the IGBT gate voltage being generated by gate driver 31. Negative voltage v1 added to the gate drive signal tends to slow down the speed at which the IGBT output current $I_C$ decreases. By virtue of the added control brought about by the use of the gate coils tending to slow down the decrease of the IGBT current, it becomes possible to design the gate and gate driver circuitry to provide a reduced gate resistance value. A reduced gate resistance tends to increase the slope of the voltage $V_{CE}$ rise as shown at 35 in FIG. 4A while increasing the speed at which the IGBT output current $I_C$ decreases as shown at 36 in FIG. 4B. Considering the comprehensive impact of gate coils and reduced gate resistance, by keeping the same current decreasing slope (by virtue of the gate coils and reduced gate resistance) while increasing the voltage increasing slope (by virtue of the reduced gate resistance), the total switching period and switching energy loss are reduced, while the voltage spike remains the same. FIG. 4C shows the cumulative energy loss during turn-off ($E_{OFF}$) of an IGBT. A trace 40 shows energy loss without the gate coil of the present invention, and trace 41 shows energy loss with the gate coil of the present invention. Energy loss is decreased by about 28% (from 19 milliJoules down to 14 milliJoules).

Figure 5A:
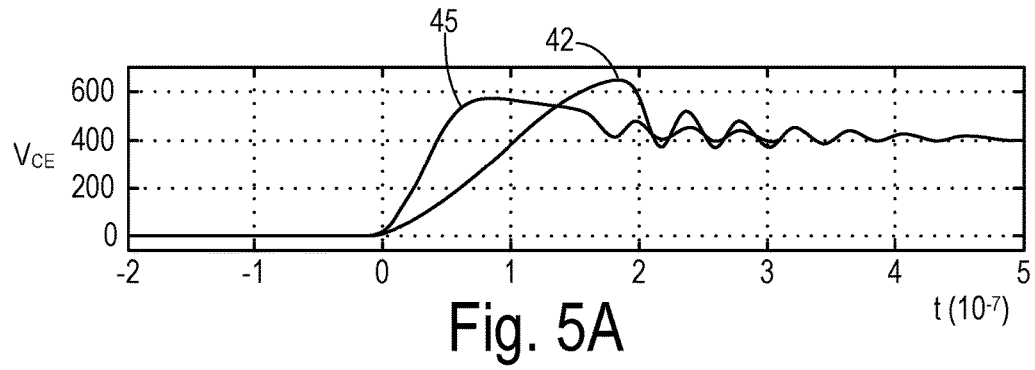
FIGS. 5A, 5B, and 5C are graphs showing collector voltage, collector current, and switching efficiency, respectively, during the turning off of two switching devices simultaneously in the electric drive of FIG. 3.
Figure 5B:
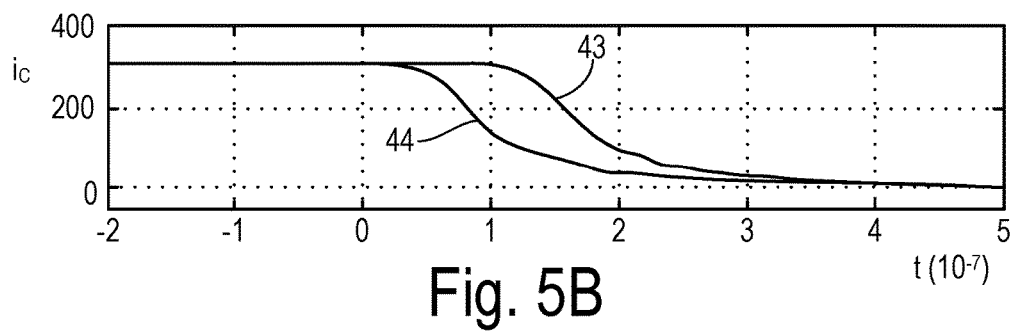
Figure 5C:
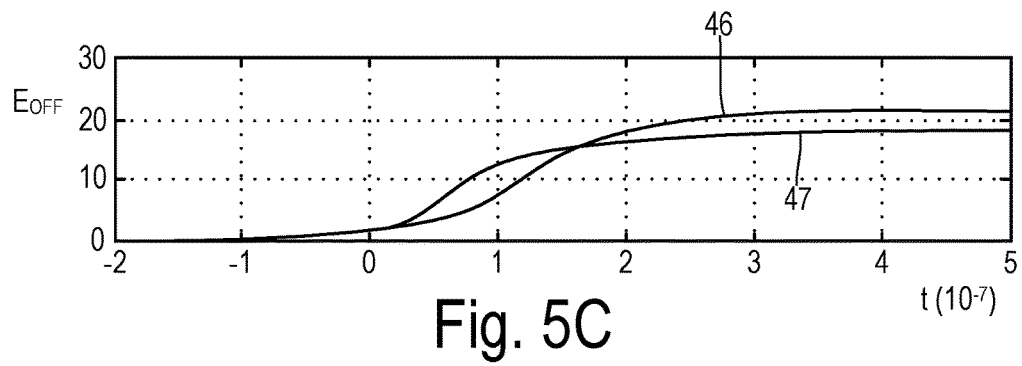

In the special case when two IGBTs are turned off simultaneously, each IGBT creates a negative dIk/dt which add together resulting in an even higher combined dIdc/dt in the DC link. The higher dIdc/dt causes a higher voltage spike as shown at 42 in FIG. 5A. However, the higher dIdc/dt also causes a higher induced voltage on link inductance $L_{DC}$ which is sensed by the gate coils. The sensed negative voltages v1 and v2 are accordingly increased so that there is a larger slowdown of the rates at which the IGBT currents decrease as shown at 44 in FIG. 5B (the current decrease rate without the gate coils is shown at 43). The reduction in the decay rate of current shown at 43 in FIG. 5B results in a reduction of the magnitude of the voltage spikes across the IGBTs during turn-off as shown at 45 in FIG. 5A. In particular, the IGBT turn-off spike is reduced by 80V using the invention in the special case. An energy loss shown at 46 in FIG. 5C which results without the gate coils of the invention can be reduced to the energy loss shown at 47 by using the gate coils.

Figure 6:
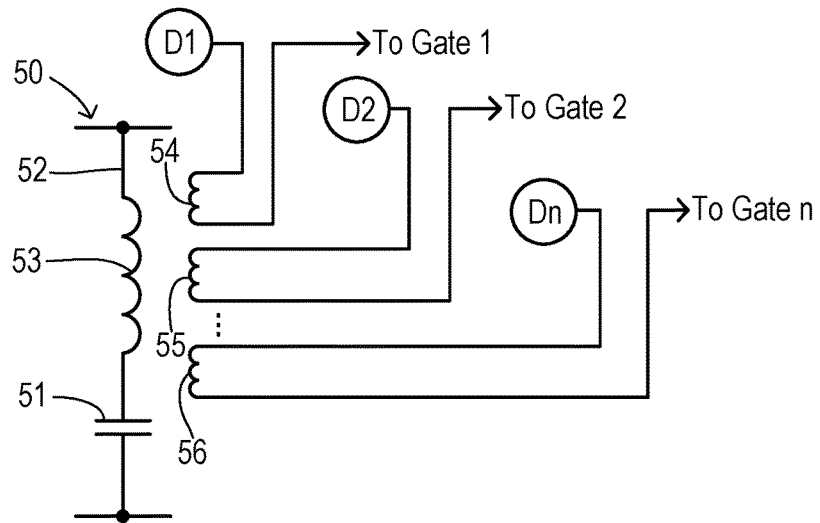
FIG. 6 is a schematic diagram showing a first embodiment of the inductive coupling between the DC link and the gate loops.

Preferably, di/dt sensing coils are implemented for all the IGBTs in the generator inverter, the motor inverter, and the VVC. Each sensing coil is electrically isolated from the others. In a first embodiment shown in FIG. 6, each IGBT gate loop and gate driver is connected to a dedicated gate coil which is magnetically coupled directly with a link inductance. Thus, a DC link 50 includes a link capacitor 51 and a busbar 52 exhibiting a link inductance 53. A sensing coil 54 is connected between a gate driver D1 and a gate loop 1 of a first IGBT (not shown). A sensing coil 55 is connected between a gate driver D2 and a gate loop 2 of a second IGBT (not shown). A sensing coil 56 is connected between a gate driver Dn and a gate loop n of an nth IGBT (not shown). This embodiment is straightforward but it may in some cases be difficult to provide sufficient space around busbar 52 to accommodate all the necessary gate coils.

Figure 7:
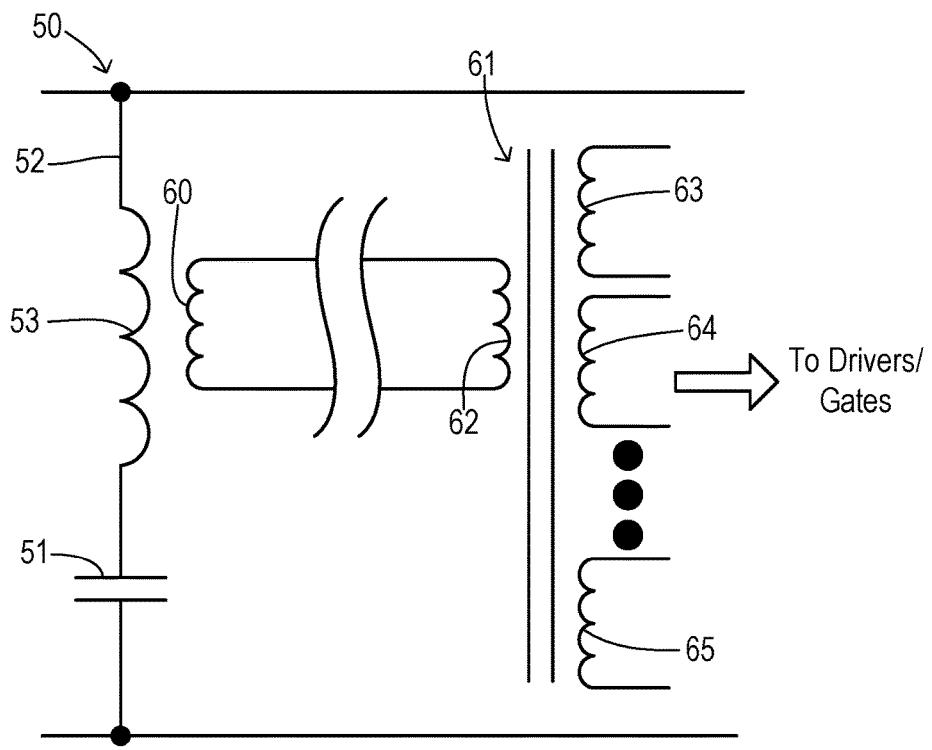
FIG. 7 is a schematic diagram showing a second embodiment of the inductive coupling, wherein a transformer is used between the DC link and the gate loops.

An alternate embodiment is shown in FIG. 7 wherein only one gate sensing coil 60 is directly magnetically coupled to busbar 52 for sensing the dIdc/dt. The output of coil 60 is connected to a transformer 61 with a primary winding 62 and multiple secondary output windings 63-65 for galvanic isolation. The transformer output windings are connected to respective IGBT gate loops. The transformer can be located on a gate drive board, for example.

The action of the gate coils coupled to the DC link inductance only needs to be present during a turn-off transient for each individual IGBT. During times other than when an IGBT is turning off, the presence of the gate coils could potentially couple undesired signals to the gate of an IGBT which interfere with its intended ON or OFF state. To prevent the IGBTs from being falsely triggered by the coupling mechanism, the di/dt control of the gate coils is preferably only activated during the switching period of the respective IGBT.

Figure 8:
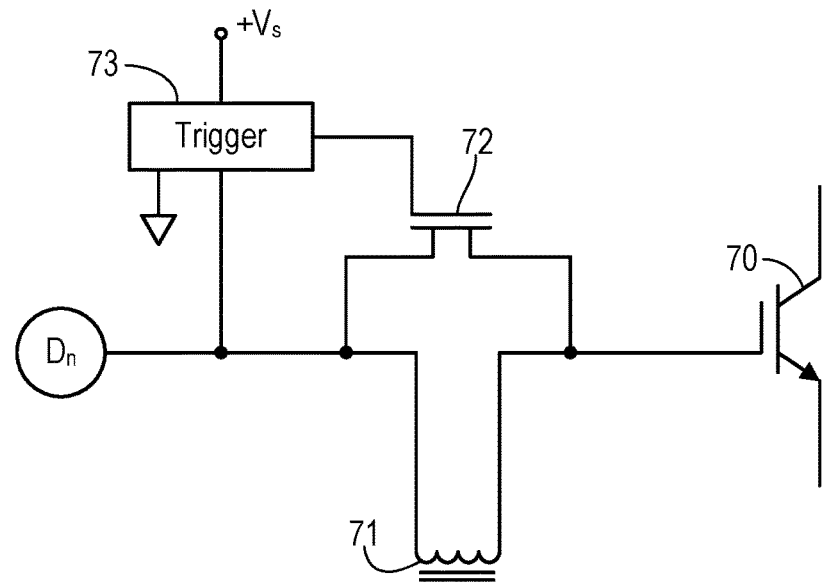
FIG. 8 is a schematic diagram showing an embodiment of the gate loop wherein the inductive coupling is selectively bypassed.
Figure 9:
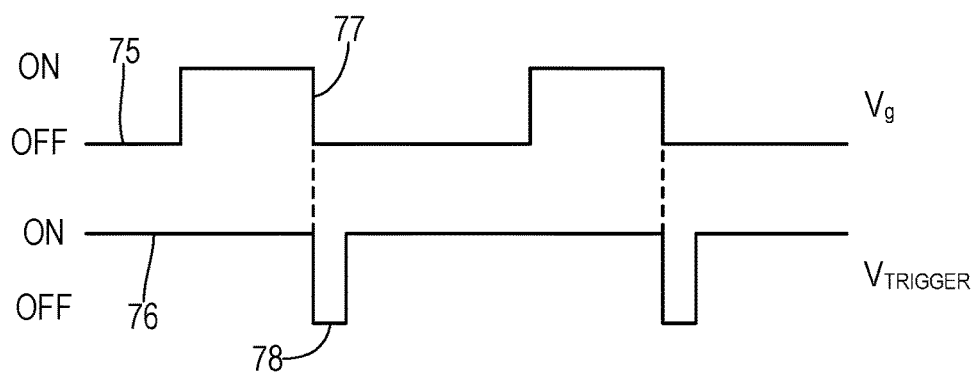
FIG. 9 is a diagram showing a gate drive signal and a bypass control signal according to the circuit of FIG. 8.

As shown in one embodiment in FIG. 8, a gate coil may be bypassed except during the switching transient (e.g., when the IGBT enters the steady state after switching on or off, the gate is tied to supply voltages $Vg_{ON}$ or $Vg_{OFF}$ from the gate driver directly). The output of a gate driver $D_n$ is coupled to a gate terminal of an IGBT 70 through a gate coil 71. A bypass MOSFET 72 has its drain and source terminals coupled across gate coil 71 and its gate terminal coupled to a trigger circuit 73. An input of trigger circuit 73 is connected to receive the gate drive signal from driver $D_n$. Trigger circuit 73 also receives a supply voltage $V_S$. In order to activate MOSFET 72 so that it bypasses gate coil 71 except during a turn-off event of IGBT 70, trigger circuit 73 may include a comparator and a timing circuit for generating a gate signal for driving MOSFET 72 as shown in FIG. 9. A gate drive signal 75 is output from IGBT gate driver $D_n$. IGBT 70 turns off in response to a falling edge 77 in gate drive signal 75. An output voltage 76 ($V_{TRIGGER}$) from trigger circuit 73 has a level which turns on MOSFET 72 except when it detects falling edge 77. In response to falling edge 77, output voltage 76 switches to a level which turns off MOSFET 72 for a predetermined time. Thus, a turn-off pulse 78 is generated according to the nominal time required to complete the turn-off transient, thereby activating gate coil 71 for the appropriate time. A trigger circuit and bypass switch would be included for each of the IGBTs using a gate coil. Other methods of bypassing a gate coil will readily occur to one skilled in the art, such as using a depletion mode MOSFET instead of enhancement mode. It would also be straightforward to deactivate the bypass MOSFET during a turn-on transient of the IGBTs.

Figure 10:
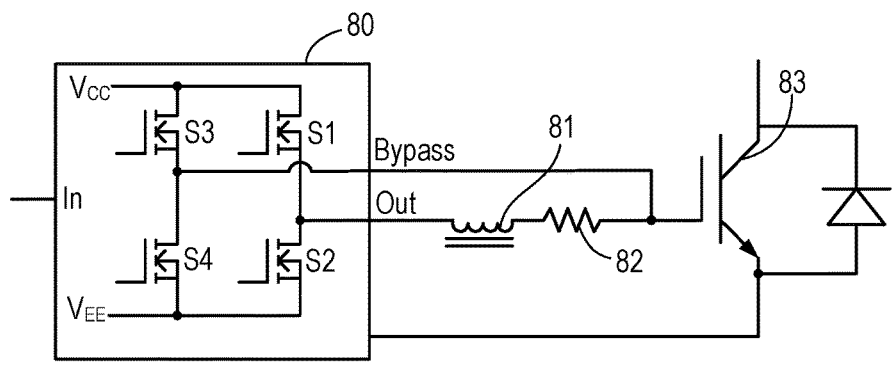
FIG. 10 is a schematic diagram showing another embodiment of a gate driver selectively bypassing the inductive coupling.
Figure 11A:
FIGS. 11A-11D are diagrams showing switching signals for the circuit of FIG. 10.
Figure 11B:
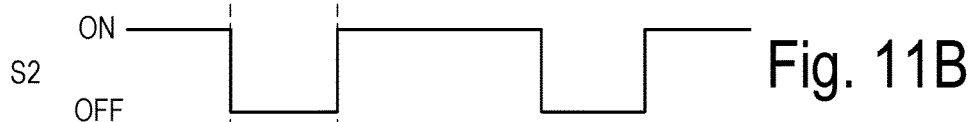
Figure 11C:
Figure 11D:
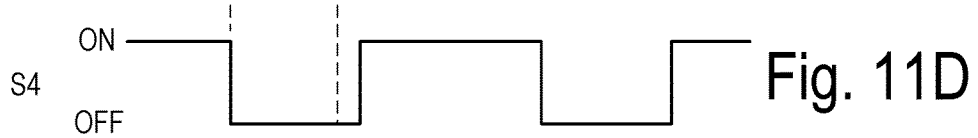

A further example of the gate driver is shown in FIG. 10 wherein a switch block 80 has an input terminal IN for receiving a gate command signal. Switches S1-S4 are connected as shown with a junction between switches S1 and S2 providing an output terminal OUT connected to a gate coil 81. Gate coil 81 is inductively coupled to the link inductance (not shown) and is connected through a gate resistor 82 to a gate terminal of a main switching IGBT 83. A junction between switches S3 and S4 provides an output terminal BYPASS which connects directly to the gate of IGBT 83, bypassing gate coil 81 and gate resistor 82.

By appropriate switching of switches S1-S4, a gate signal driving IGBT 83 is influenced by gate coil 81 and resistor 82 during a switching transient and is unaffected by them when the ON/OFF state of IGBT 83 is at a steady state. S1 and S2 are used to tie output OUT to the IGBT gate turn-on voltage $V_{CC}$ or turn-off voltage $V_{EE}$, respectively. S3 and S4 are used to tie output BYPASS to the IGBT gate turn-on voltage or turn-off voltage, respectively. As depicted in FIGS. 11A-11D, IGBT 83 is in an OFF state since both outputs OUT and BYPASS are connected to $V_{EE}$ (S2 and S4 are ON and S1 and S3 are OFF). To turn on IGBT 83, switching signals to S1, S2, and S4 change state so that turn-on voltage $V_{CC}$ is coupled to output OUT, but the switching signal to S3 remains at the OFF state for a predetermined delay so that output BYPASS remains low during the switching transient. After the delay, the switching signal to S3 goes high so that IGBT 83 is held in the ON state and gate coil 81 and gate resistor 82 are bypassed. During the subsequent command to turn off IGBT 83, it is the change of state of the switching signal for S4 that is delayed for a predetermined time corresponding to the switching transient of IGBT 83.

What is claimed is:

1. An electrified vehicle propulsion system comprising:
   a DC link having a link capacitor and a link inductance;
   a first converter bridge with a first phase leg having first upper and lower switching devices, each switching device having a respective gate loop;
   a second converter bridge with a second phase leg having second upper and lower switching devices, each switching device having a respective gate loop;
   a plurality of gate drivers providing gate drive signals to respective gate loops for turning the respective switching devices on and off;
   a plurality of gate coils, each gate coil connected in series between a respective gate driver and a respective gate loop and each respectively inductively coupled to the link inductance.

2. The system of claim 1 wherein the DC link comprises a busbar, and wherein each gate coil is directly magnetically coupled with the busbar.

3. The system of claim 1 wherein the DC link comprises a busbar, and wherein the system further comprises:
   a sensing coil magnetically coupled to the busbar; and a transformer having a primary winding connected to the sensing coil and having a plurality of secondary windings forming the gate coils.

4. The system of claim 1 further comprising a plurality of bypass paths, each bypass path connected between a respective gate drive and a respective gate loop, wherein each bypass path is activated to selectably bypass a respective gate coil except during respective transitions in a respective gate drive signal.

5. The system of claim 4 wherein the respective transitions correspond to turning off a respective switching device.

6. The system of claim 1 wherein the first converter bridge includes a plurality of phase legs, each phase leg having respective upper and lower switching devices, wherein each switching device has a respective gate coil.

7. The system of claim 6 wherein the second converter bridge comprises a variable voltage converter controlling a voltage on the DC link.

8. The system of claim 1 wherein:
the first converter bridge comprises a motor inverter including a plurality of phase legs, each phase leg having respective upper and lower switching devices, wherein each switching device has a respective gate coil; and
the second converter bridge comprises a generator inverter including a plurality of phase legs, each phase leg having respective upper and lower switching devices, wherein each switching device has a respective gate coil.

9. An electric drive inverter, comprising:
a DC link having a link inductance;
a plurality of phase legs, each having upper and lower switching devices, each device having a gate loop;
a plurality of gate drivers providing gate drive signals to respective gate loops; and
a plurality of gate coils, each gate coil connected in series between a respective gate driver and a respective gate loop and each respectively inductively coupled to the link inductance.

10. The inverter of claim 9 wherein the DC link comprises a busbar, and wherein each gate coil is directly magnetically coupled with the busbar.

11. The inverter of claim 9 wherein the DC link comprises a busbar, and wherein the inverter further comprises:
a sensing coil magnetically coupled to the busbar; and
a transformer having a primary winding connected to the sensing coil and having a plurality of secondary windings forming the gate coils.

12. The inverter of claim 9 further comprising a plurality of bypass paths, each bypass path connected between a respective gate drive and a respective gate loop, wherein each bypass path is activated to selectably bypass a respective gate coil except during respective transitions in a respective gate drive signal.

13. The inverter of claim 12 wherein the respective transitions correspond to turning off a respective switching device.

14. An electric vehicle drive comprising:
a DC power source;
a DC link having a link capacitor and a link inductance;
a variable voltage converter having upper and lower switching devices, each switching device having a respective gate loop;
a motor inverter with a plurality of phase legs each having upper and lower switching devices, each switching device having a respective gate loop;
a plurality of gate drivers providing gate drive signals to respective gate loops for turning the respective switching devices on and off;
a plurality of gate coils, each gate coil connected in series between a respective gate driver and a respective gate loop and each respectively inductively coupled to the link inductance.

15. The electric vehicle drive of claim 14 further comprising:
a generator inverter with a plurality of phase legs each having upper and lower switching devices, wherein each switching device has a respective gate loop, and wherein each respective gate loop is inductively coupled to the link inductance by a respective gate coil.

16. The electric vehicle drive of claim 14 wherein the DC link comprises a busbar, and wherein each gate coil is directly magnetically coupled with the busbar.

17. The electric vehicle drive of claim 14 wherein the DC link comprises a busbar, and wherein the electric vehicle drive further comprises:
a sensing coil magnetically coupled to the busbar; and
a transformer having a primary winding connected to the sensing coil and having a plurality of secondary windings forming the gate coils.

18. The electric vehicle drive of claim 14 further comprising a plurality of bypass paths, each bypass path connected between a respective gate drive and a respective gate loop, wherein each bypass path is activated to selectably bypass a respective gate coil except during respective transitions in a respective gate drive signal.

19. The electric vehicle drive of claim 18 wherein the respective transitions correspond to turning off a respective switching device.

* * * * *